(12) United States Patent
Hiramatsu et al.

(10) Patent No.: US 7,399,687 B2
(45) Date of Patent: Jul. 15, 2008

(54) SUBSTRATE OF GALLIUM NITRIDE SINGLE CRYSTAL AND PROCESS FOR PRODUCING THE SAME

(75) Inventors: Kazumasa Hiramatsu, Yokkaichi (JP); Hideto Miyake, Hisai (JP); Shinya Bohyama, Ichishi-gun (JP); Takayoshi Maeda, Tottori (JP); Yoshinobu Ono, Tsukuba-gun (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 414 days.

(21) Appl. No.: 10/546,983

(22) PCT Filed: Mar. 4, 2004

(86) PCT No.: PCT/JP2004/002760

§ 371 (c)(1),
(2), (4) Date: Aug. 26, 2005

(87) PCT Pub. No.: WO2004/079802

PCT Pub. Date: Sep. 16, 2004

(65) Prior Publication Data

US 2006/0172512 A1    Aug. 3, 2006

(30) Foreign Application Priority Data

Mar. 7, 2003    (JP)    ............................. 2003-061027

(51) Int. Cl.
H01L 21/20    (2006.01)

(52) U.S. Cl. .............................. 438/483; 257/E21.108

(58) Field of Classification Search ................. 438/483, 438/438; 257/E21.097, E21.108
See application file for complete search history.

(56) References Cited

U.S. PATENT DOCUMENTS 6,562,701 B2    5/2003    Ishida et al.

(Continued)

FOREIGN PATENT DOCUMENTS

EP    1 184 897 A1    3/2002

(Continued)

OTHER PUBLICATIONS

Isao Akazaki, "Advanced Electronics I-21 III Zoku Chikkabutsu Handotai", Dec. 8, 1999, 1st edition, pp. 205-208.

(Continued)

Primary Examiner—Trung Dang
(74) Attorney, Agent, or Firm—Sughrue Mion, PLLC

(57) ABSTRACT

The present invention relates to a method for producing an epitaxial substrate having a III-V group compound semiconductor crystal represented by the general formula $In_xGa_yAl_zN$ (wherein, $x+y+z=1$, $0 \leq x \leq 1$, $0 \leq y \leq 1$, $0 \leq z \leq 1$) having reduced dislocation density, comprising a first step of covering with a mask made of a different material from the III-V group compound semiconductor so that only portions around points of the crystal constitute openings by using a III-V group compound semiconductor crystal having a plurality of projection shapes and a second step of growing the III-V group compound semiconductor crystal laterally by using the III-V group compound semiconductor crystal at the opening as a seed crystal. According to the present invention, an epitaxial substrate having a III-V group compound semiconductor crystal having low dislocation density and little warp is obtained.

2 Claims, 5 Drawing Sheets

U.S. PATENT DOCUMENTS

| | | |
|---|---|---|
| 6,720,586 B1 | 4/2004 | Kidoguchi et al. |
| 6,927,149 B2 * | 8/2005 | Sugahara et al. ............ 438/481 |
| 2002/0137342 A1 | 9/2002 | Ishida et al. |
| 2003/0119239 A1 * | 6/2003 | Koike et al. ................. 438/200 |
| 2003/0143771 A1 | 7/2003 | Kidoguchi et al. |

FOREIGN PATENT DOCUMENTS

| | | | |
|---|---|---|---|
| JP | 63-188983 | A | 8/1988 |
| JP | 2000-129000 | A | 5/2000 |
| JP | 2001-168042 | A | 6/2001 |
| JP | 2001-257166 | A | 9/2001 |
| JP | 2001345281 | A * | 12/2001 |
| JP | 2002-9004 | A | 1/2002 |
| JP | 2002-164292 | A | 6/2002 |
| JP | 2002-289541 | A | 10/2002 |
| JP | 2002-343728 | A | 11/2002 |
| JP | 2002-353152 | A | 12/2002 |

OTHER PUBLICATIONS

M. Seelmann-Eggebert et al., "Polarity of (00•1) GaN epilayers grown on a (00•1) sapphire", *Applied Physics Letters*, vol. 71, No. 18, 1997, pp. 2635.

Michael K. Kelly et al., "Large Free-Standing GaN Substrates by Hydride Vapor Phase Epitaxy and Laser-Induced Liftoff", *Jpn. J. Appl. Phys.*, vol. 38, 1999, pp. L217-L219.

* cited by examiner

Fig. 3
(A)
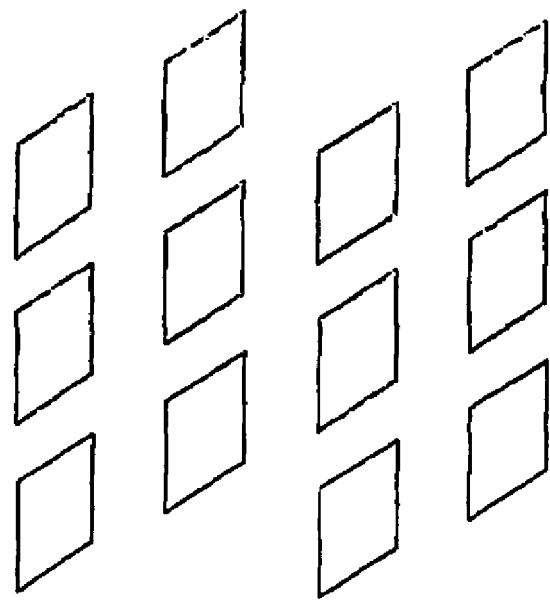
(B)
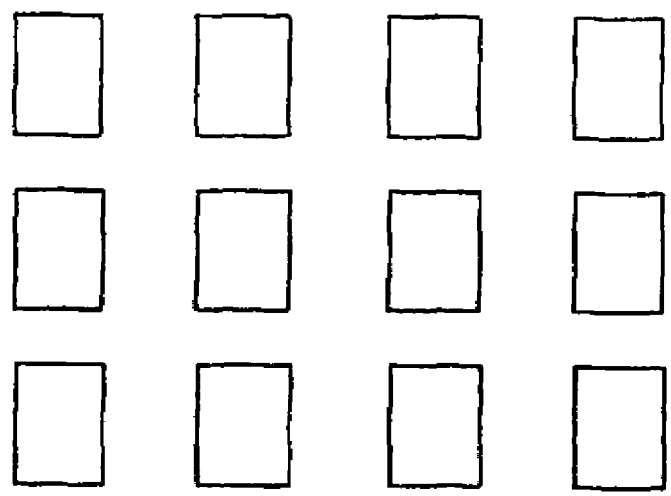

SUBSTRATE OF GALLIUM NITRIDE SINGLE CRYSTAL AND PROCESS FOR PRODUCING THE SAME

FIELD OF THE INVENTION

The present invention relates to a gallium nitride single crystal substrate and method for producing the same.

BACKGROUND ART

Nitride-based III-V group compound semiconductors represented by the general formula $In_xGa_yAl_zN$ (wherein, $x+y+z=1$, $0 \leq x \leq 1$, $0 \leq y \leq 1$, $0 \leq z \leq 1$) have controllable direct type band gap corresponding to from ultraviolet to red depending on the composition of a III group element, consequently, can be utilized as a material for a light emitting device of high efficiency ranging from ultraviolet to visible light. It is theoretically possible to manufacture an electronic device excellent in environment resistance utilizing a property as a semiconductor even at high temperatures under which conventional semiconductors cannot operate, due to larger band gap as compared with semiconductors such as GaAs and the like generally used up to now.

However, nitride-based III-V group compound semiconductors cannot easily perform crystal growth of a bulk single crystal, and free standing substrates of practically endurable nitride-based III-V group compound semiconductors are still under developing. Therefore, substrates widely used currently are sapphire and the like. Usually, methods of epitaxial growth such as a metal-organic chemical vapor deposition method (hereinafter, abbreviated as MOCVD method) are used.

However, a sapphire substrate has a lattice constant different significantly from that of a nitride-based III-V group compound semiconductor, resultantly, it is impossible to grow directly on this a crystal of a nitride-based III-V group compound semiconductor. Therefore, there is invented and usually used a method of growing amorphous GaN, AlN or the like once at lower temperature, relaxing lattice strain, and then, growing a crystal of a nitride-based III-V group compound semiconductor on this (Japanese Patent Application Laid-Open (JP-A) No. 63-188983). By this method, the quality of a crystal of a nitride-based III-V group compound semiconductor has increased dynamically.

However, since a discrepancy of lattice constant between a sapphire substrate and a crystal of a nitride-based III-V group compound semiconductor is not resolved, dislocation, this is a crystal defect, is still present at a density of as high as $10^9$ to $10^{10}$ $cm^{-2}$ in the crystal of a nitride-based III-V group compound semiconductor. This dislocation is a problem since it remarkably decreases the performance of an device such as life or the like.

Then, recently, as a method of reducing dislocation generating based on the discrepancy of lattice constant from sapphire, there is suggested a method in which on GaN having dislocation present in high density, a mask patterned with $SiO_2$ and the like is formed, GaN is grown from a window portion of the mask and the mask is covered by lateral growth to obtain a flat GaN crystal, and there is also reported that dislocation density can be decreased to $10^7$ $cm^{-2}$ by blocking dislocation from the template using a mask (Appl. Phys. Lett. 71(18) 2637 (1997)).

On the other hand, as a method of obtaining a free standing GaN substrate, a method is reported in which on a sapphire substrate and the like, a GaN crystal is epitaxially grown, and sapphire and the like are removed by using etching or laser (Jpn. J. Appl. Phys. vol. 38, p. L217-219 (1999), JP-A No. 2000-129000).

However, this method has a problem that because of a difference in thermal expansion coefficient between sapphire and the like and GaN, warp occurs in a cooling step after growth, consequently, warp or crack remains on the resulted free standing substrate, further, a problem that dislocation density sufficiently reduced cannot be obtained.

As a method of solving these problems, there is suggested a method in which a metal thin film made of Ti and the like having a catalytic action promoting decomposition of GaN is formed on the surface of GaN, then, a thermal treatment is conducted on this under an atmosphere containing $NH_3$, to form TiN in the form of mesh on GaN and simultaneously to form a void of reverse cone shape on the ground GaN in the mesh space, and GaN is laterally grown on this TiN, then, this is peeled by using mixed liquid of hydrofluoric acid and nitric acid to obtain a free standing substrate having a dislocation density reduced to about $10^7$ $cm^{-2}$ and little warp. (JP-A No. 2002-343728)

However, also this method has a problem that warp is not sufficient though it is decreased and nitriding of Ti and formation of a void in GaN are conducted simultaneously in a thermal treatment, consequently, control of the void proportion and adjustment of the degree of nitriding of Ti and the like are difficult and stable production of a substrate of low dislocation is difficult, a problem that mixed liquid of hydrofluoric acid and nitric acid is necessary for conducting peeling, and other problems.

DISCLOSURE OF THE INVENTION

The present inventors have intensively studied for solving the above-mentioned problems and resultantly found that a nitride-based III-V group compound semiconductor crystal having a specific structure can be formed in which a point in the form of projection is used as a seed crystal, the whole surface of the crystal is flat, and voids are left internally regularly and periodically, by using a nitride-based III-V group compound semiconductor crystal having a plurality of projection shapes, masking portions other than the points in the form of projection with a mask, then, growing the crystal laterally, that this crystal has dislocation density equal to or less than the level obtained in conventional methods, further that, by controlling the cross-sectional area of the point in the form of projection to a certain level or less, a template and an upper crystal can be peeled easily without using etching or laser after crystal growth and a free standing substrate having low dislocation density and showing extremely small warp can be obtained, leading to completion of the invention.

Namely, the present invention provides

[1] A method for producing an epitaxial substrate having a III-V group compound semiconductor crystal represented by the general formula $In_xGa_yAl_zN$ (wherein, $x+y+z=1$, $0 \leq x \leq 1$, $0 \leq y \leq 1$, $0 \leq z \leq 1$) having reduced dislocation density, comprising a first step of covering with a mask made of a different material from the III-V group compound semiconductor so that only portions a round points of the crystal constitute openings by using a III-V group compound semiconductor crystal having a plurality of projection shapes and a second step of growing the III-V group compound semiconductor crystal laterally by using the III-V group compound semiconductor crystal at the opening as a seed crystal,

[2] A method for producing a free standing substrate of a III-V group compound semiconductor crystal represented by the general formula $In_xGa_yAl_zN$ (wherein, $x+y+z=1$, $0 \leq x > 1$, $0 \leq y \leq 1$, $0 \leq z \leq 1$) having reduced dislocation density, comprising a first step of covering with a mask made of a different material from the III-V group compound semiconductor so that only portions around points of the crystal constitute openings and the sum of the areas of the openings is ½ or less of the area projected from the upper direction of the III-V group compound semiconductor crystal having a plurality of projection shapes by using a III-V group compound semiconductor crystal having a plurality of projection shapes and a second step of growing the III-V group compound semiconductor crystal laterally by using the III-V group compound semiconductor crystal at the opening as a seed crystal,

[3] The method according to [1] or [2], wherein the III-V group compound semiconductor crystal having a plurality of projection shapes in the first step is obtained by using the III-V group compound semiconductor crystal as a template, covering this with a mask having a plurality of openings, then, selectively growing the III-V group compound semiconductor crystal from the opening so as to form an oblique facet against the surface of the template,

[4] A III-V group compound semiconductor epitaxial substrate containing a void surrounded by a plane parallel to a substrate and an oblique plane covered with a different material from a III-V group compound semiconductor, and

[5] A free standing substrate of a III-V group compound semiconductor crystal having reduced dislocation density obtained by the method according to [2].

BRIEF EXPLANATION OF DRAWINGS

FIG. 3 (A) shows a mask pattern used in covering a template in Example 3, and (B) shows a mask pattern used in covering a template in Example 4.

DESCRIPTION OF MARKS

Figure 1:
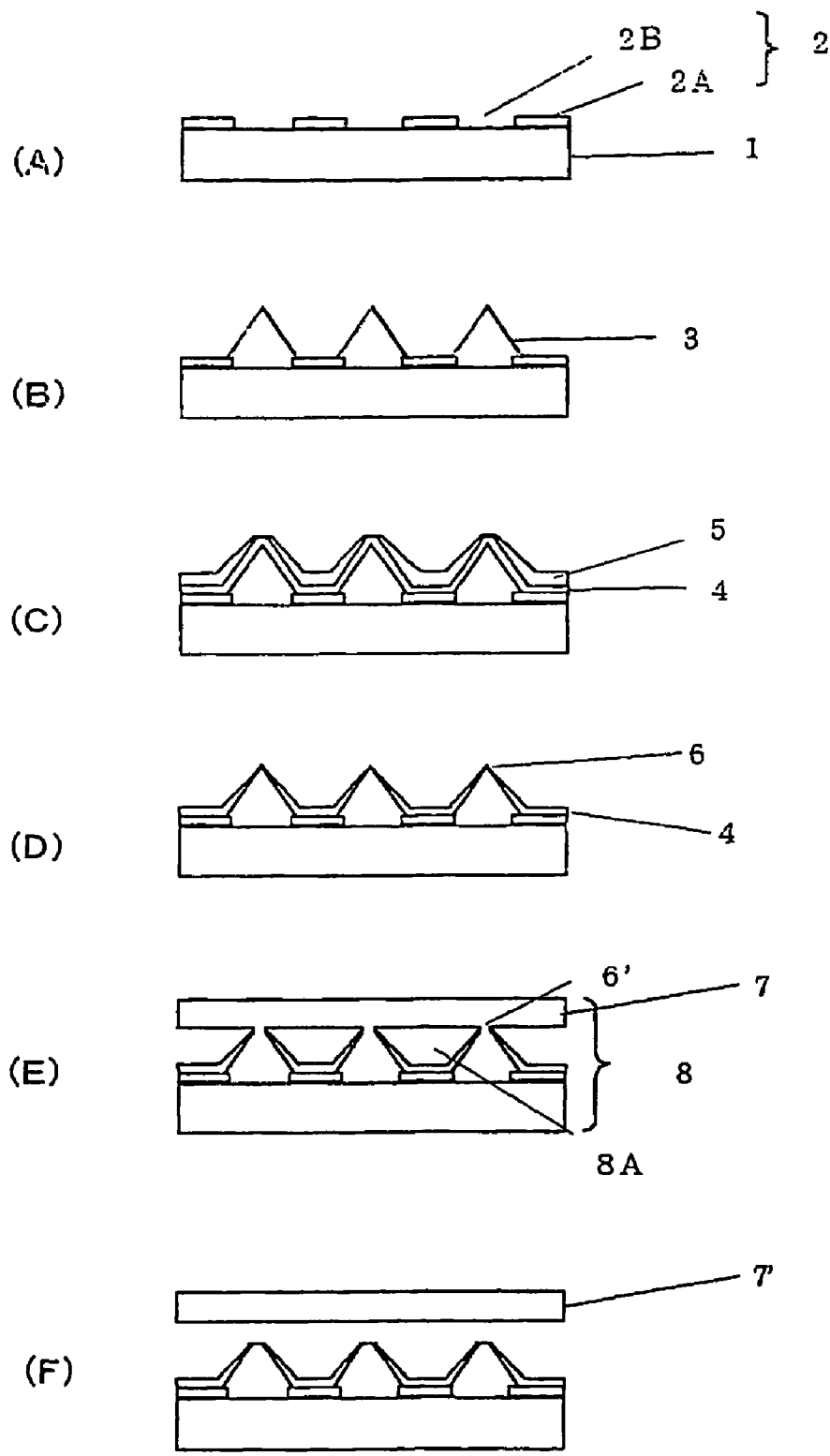
FIG. 1 is a schematic view showing a process for producing a GaN free standing substrate showing one example of the present invention.

1: ground GaN epitaxial crystal
2: pattern
2A: mask portion
2B: opening
3: crystal having projection shape
4: mask used in first step
5: photoresist layer
6: GaN opening (exposed portion, seed crystal)
6': connection portion
7: grown crystal
7A: association portion
7': free standing substrate
8: epitaxial crystal having void internally
8A: void
9: n type layer
10: light emitting layer
11: p type layer
12: n electrode
13: p electrode

BEST MODES FOR CARRYING OUT THE INVENTION

As the method of growing a III-V group compound semiconductor crystal represented by the general formula $In_xGa_yAl_zN$ (wherein, $x+y+z=1$, $0 \leq x \leq 1$, $0 \leq y \leq 1$, $0 \leq z \leq 1$) in the present invention, a HVPE method and a MOVPE method are suitably used. The HVPE method can obtain an excellent crystal in a short period because of large growth speed obtainable and resultantly can be used suitably in the present invention. The MOVPE method can effect crystal growth with good uniformity on a lot of substrates and resultantly can also be used suitably in the present invention. These methods can be conducted in combination, and for example, the step of growing a III-V group compound semiconductor crystal having a plurality of projection shapes may be conducted by the MOVPE method and the second step, namely, lateral growth for obtaining a III-V group compound semiconductor crystal having reduced dislocation density may be conducted by the HVPE method, in the present invention.

As conditions for effecting crystal growth, temperature, pressure, carrier gas, raw material and the like are important, and conventionally known conditions of them can be used.

For example, in the second step, the growth pressure is usually 0.001 atm or more. In this step, crystallinity tends to lower when the pressure is 0.001 atm or less. It is preferably 0.005 atm or more, further preferably 0.01 atm or more. Crystallinity is improved in some cases when the growth pressure is higher, and a MOVPE apparatus or HVPE apparatus generally used for crystal growth is not used industrially at so high growth pressure, therefore, the growth pressure in re-growth is preferably 10 atm or less.

Regarding the carrier gas, those used in usual MOVPE and HVPE such as hydrogen, nitrogen, helium, argon and the like can be used. As the raw material, conventionally known materials can be used.

The process of the present invention will be illustrated below using FIG. 1.

The present invention is characterized in that a III-V group compound semiconductor crystal having a plurality of projection shapes is used, and the projection shape means a convex shape formed as oblique facet and having no plane parallel to the ground substrate, and includes that having a point extending linearly and that having a point in the form of dot.

Such a III-V group compound semiconductor crystal having a plurality of projection shapes can be produced, for example, as shown in FIGS. 1 (A) and (B).

That is, as the ground substrate 1, a GaN epitaxial crystal carrying a pattern formed is used suitably. Here, the substrate is not limited to a GaN epitaxial crystal, and a GaN buffer layer or AlN buffer layer grown at lower temperature carrying a pattern formed may be used to obtain the effect of the present invention in some cases.

As the material used in pattern formation, in usual, materials different from the III-V group compound semiconductor crystal are suitably used. These materials are required to stand a high temperature atmosphere containing ammonia used for growth of a crystal in the form of projection, and examples thereof include metal oxide made of $SiO_2$, $TiO_2$ and the like, nitride made of $Si_3N_4$, BN (boron nitride) and the like, single metal made of W (tungsten), Mo (molybdenum), Cr (chromium), Co (cobalt), Si (silicon), gold, Zr (zirconium), Ta (tantalum), Ti (titanium), Nb (niobium), nickel, platinum, V (vanadium), Hf (hafnium), Pd (palladium) and the like, and laminated structures of them.

In addition, that having an irregular pattern formed on the surface of a GaN epitaxial crystal by dry etching and the like, and that having an irregular pattern formed on a substrate made of sapphire and the like by dry etching and the like can also be used to obtain the effect of the present invention in some cases.

As the pattern form, those conventionally known can be used. Specifically, that having stripe-shaped masks having a constant width arranged in parallel via an opening of constant width generally called line/space, alternatively, those having a ground partially exposed in the form of circle or polygon, and the like are mentioned. These pattern forms can be selected depending on the subsequent growth conditions and pattern form.

In the case of a line/space pattern, the width of a mask portion is preferably 0.05 μm or more and 20 μm or less. When the width of a mask portion is smaller than 0.05 μm, the effect of reduction in defect density of the present invention is not remarkable. When larger than 20 μm, time required for embedding of a mask portion becomes too long, impractically. Due to the same reason, the distance between openings is preferably 0.05 μm or more and 20 μm or less also in the case of a pattern having an opening in the form of circle or polygon.

In the case of a line/space pattern, the width of an opening (exposed portion of ground) is preferably 0.01 μm or more and 20 μm or less. When the width of an opening is smaller than 0.01 μm, current semiconductor processes are not preferable since it is not easily fabricated in practically correct form. When larger than 20 μm, the effect of reduction in defect of the present invention is not remarkable. Due to the same reason, the size of an opening is preferably 0.01 μm or more and 20 μm or less also in the case of a pattern having an opening in the form of circle or polygon. FIG. 1 shows schematically a line/space pattern in which the width of a mask portion 2A and the width of an opening 2B are approximately the same.

In the case of a line/space pattern, preferable stripe direction is a <1-100> direction or <11-20> direction of a hexagonal GaN crystal. Particularly preferable is a <1-100> direction.

Here, the pattern is not limited to a stripe along one direction, and a pattern superimposed stripes along a plurality of directions may also be used. For example, by using stripes along two directions, that having projection structures having a point in the form of dot arranged two-dimensionally in disaggregation mode, and that having projection structures having a point in the form of line crossed along two directions, and the like can be produced.

Also in the case of use of stripes along a plurality of directions, the stripe direction is preferably a <1-100> direction or <11-20> direction of a hexagonal GaN crystal. Because of symmetry of a nitride crystal in (0001) C plane, these directions constitute crystallographically equivalent direction every 60°. That is, two <1-100> directions crossing at 60°, two <11-20> directions crossing at 600, a combination of a <1-100> direction and a <11-20> direction crossing at 90°, and the like can be suitably used.

For forming projection shapes, growth conditions for easy formation of oblique facet are usually used. Specifically, the above-mentioned shape can be formed easily when the growth temperature is relatively lower, for example, when it is 1050° C. or less, when the ratio of the feeding amount of a V group raw material to the feeding amount of a III group raw material is larger, when an opening of a pattern is smaller as compared with the width of a pattern, and when the growth pressure is higher. By conducting re-growth until disappearance of a plane parallel to the surface of a template in a crystal grown under such conditions, a crystal 3 having projection shapes formed only of oblique facet is obtained. Even after disappearance of a plane parallel to the surface of a template in a long crystal, growth may also be continued only with oblique facet by continuing growth under the same condition.

The first step of the present invention is a step of using a III-V group compound semiconductor crystal having a plurality of projection shapes as described above and covering with a mask made of a different material from the III-V group compound semiconductor so that only portions around points of the crystal constitute openings, and the mask formation method includes (1) a method of forming a mask so as to cover the whole surface of projection shapes, then, removing the mask only at a point, (2) a method of forming a pattern with a photoresist and the like so that only a point is covered with a mask material, then, forming a mask material, and removing a mask material at portions other than the point (so-called, lift off method), and other methods. For samples having projection shapes, the method (1) is suitably used.

Namely, because of projection shapes, the thickness of an applied layer 5 of a photoresist is smaller around a projection point and larger around a lower part, therefore, when oxygen plasma ashing is conducted, a photoresist layer disappears preferentially from a portion of smaller photoresist thickness (namely, projection point) to expose a mask 4. Thereafter, by etching the mask, a GaN semiconductor can be exposed only around a projection point (FIGS. 1 (C), (D)). The area of an opening (exposed portion) 6 at a projection point can be controlled by adjusting layer thickness distribution determined depending on application conditions of a photoresist, oxygen plasma ashing time and the like. Here, as the material used in a mask 4, the same materials as shown in production of the above-mentioned crystal having projection shapes can be used.

The second step of the present invention is a step of using a III-V group compound semiconductor crystal at the opening obtained as described above as a seed crystal and growing the III-V group compound semiconductor crystal laterally, and for obtaining a flat layer 7, growth may be advantageously conducted under conditions wherein lateral growth is dominant than growth along the longitudinal direction. Under such conditions, a (0001) plane is easily formed, and the above-mentioned conditions for growth a crystal having projection shapes are preferably conditions in which main condition factors are shifted to the opposite side. Specifically, a flat layer is obtained easily when the growth temperature is relatively higher, for example when it is 900° C. or more, when the ratio of the feeding amount of a V group raw material to the feeding amount of a III group raw material is smaller, when the growth pressure is relatively lower, for example when it is 2 atom or less.

As the crystal growth method of the second step, HVPE giving large growth speed is suitably used, and additionally, a method combining two growth methods may also be used in which MOVPE manifesting good form controllability is used until a flat plane is obtained, then, that having larger thickness is produced using HVPE.

A crystal 7 having flat whole surface produced here is connected with a template only at a connection portion 6' which is originally a seed crystal portion, therefore, lattice strain ascribable to a difference in thermal expansion coefficient from a ground substrate made of sapphire and the like concentrates at this portion, and resultantly, cracking is formed at this portion and peeling from a template naturally occurs in some cases. Conditions enabling peeling without such special treatment depend on the thickness of a ground substrate made of sapphire and the like, the thickness of a crystal grown in the second step, the area proportion of an opening (area proportion of a seed crystal portion), namely, the proportion of the sum of the areas of mask openings to the area projected from the upper direction of the III-V group compound semiconductor crystal having a plurality of projection shapes, and the like. Qualitatively, natural peeling easily occurs when the crystal thickness in the second step is larger and the area proportion of an opening is smaller.

In the case of a sapphire ground substrate usually used having a thickness of about 400 μm, the thickness of a crystal grown in the second step is preferably 10 μm or more, and more preferably 20 μm or more. The area proportion of an opening is preferably ⅔ or less, more preferably ½ or less. When smaller than 10 μm, when the area proportion is larger than ⅔, and the like, there is a tendency that natural peeling is not caused easily.

A free standing substrate thus naturally peeled is not influenced significantly by a ground substrate, consequently, warp thereof is extremely small. In the case of no natural peeling, it is also possible to cause peeling by applying mechanical stress or thermal stress to obtain a free standing substrate.

Figure 4:
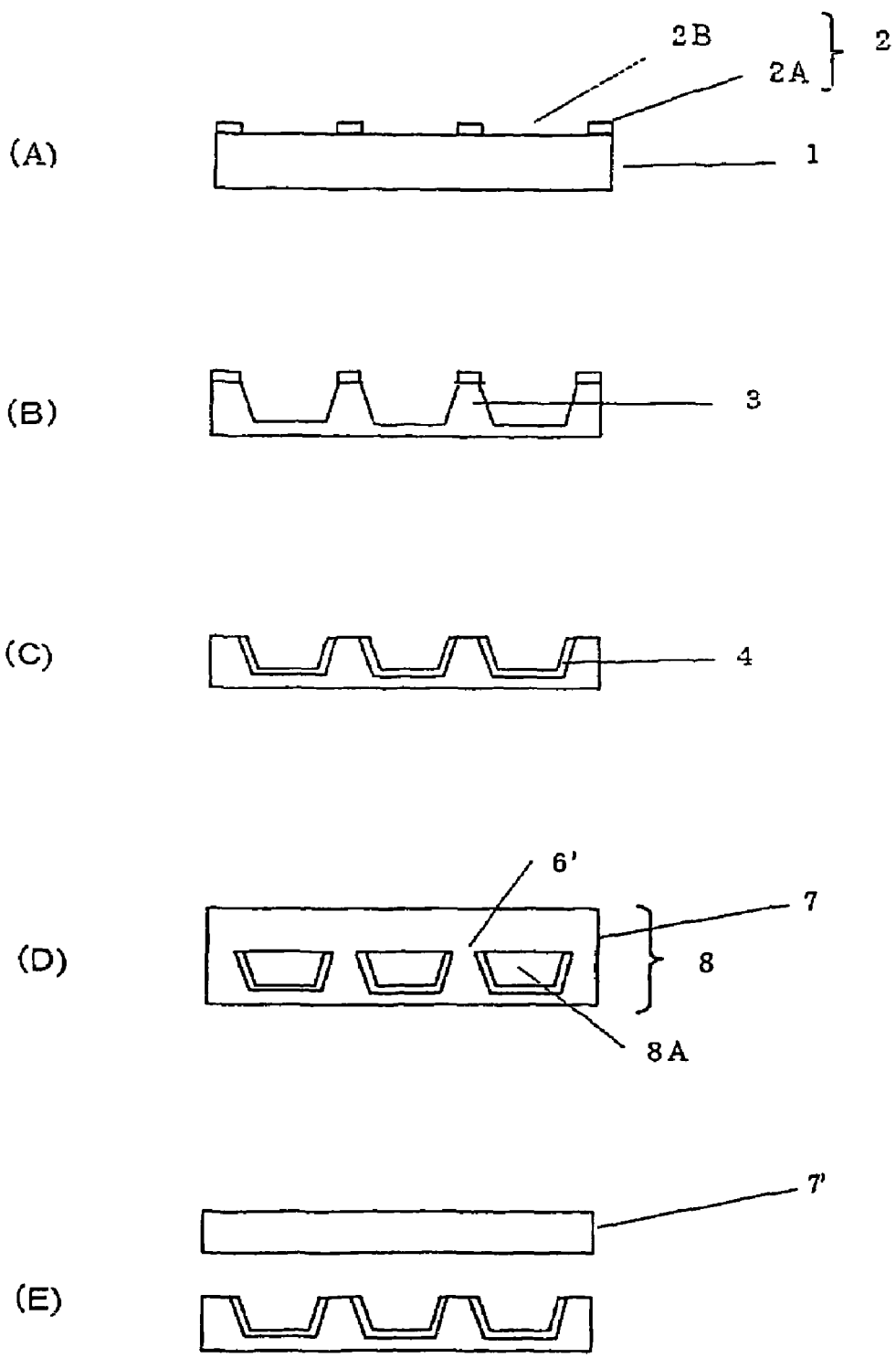
FIG. 4 is a schematic view showing a process for producing a free standing substrate of the present invention.
Figure 5:
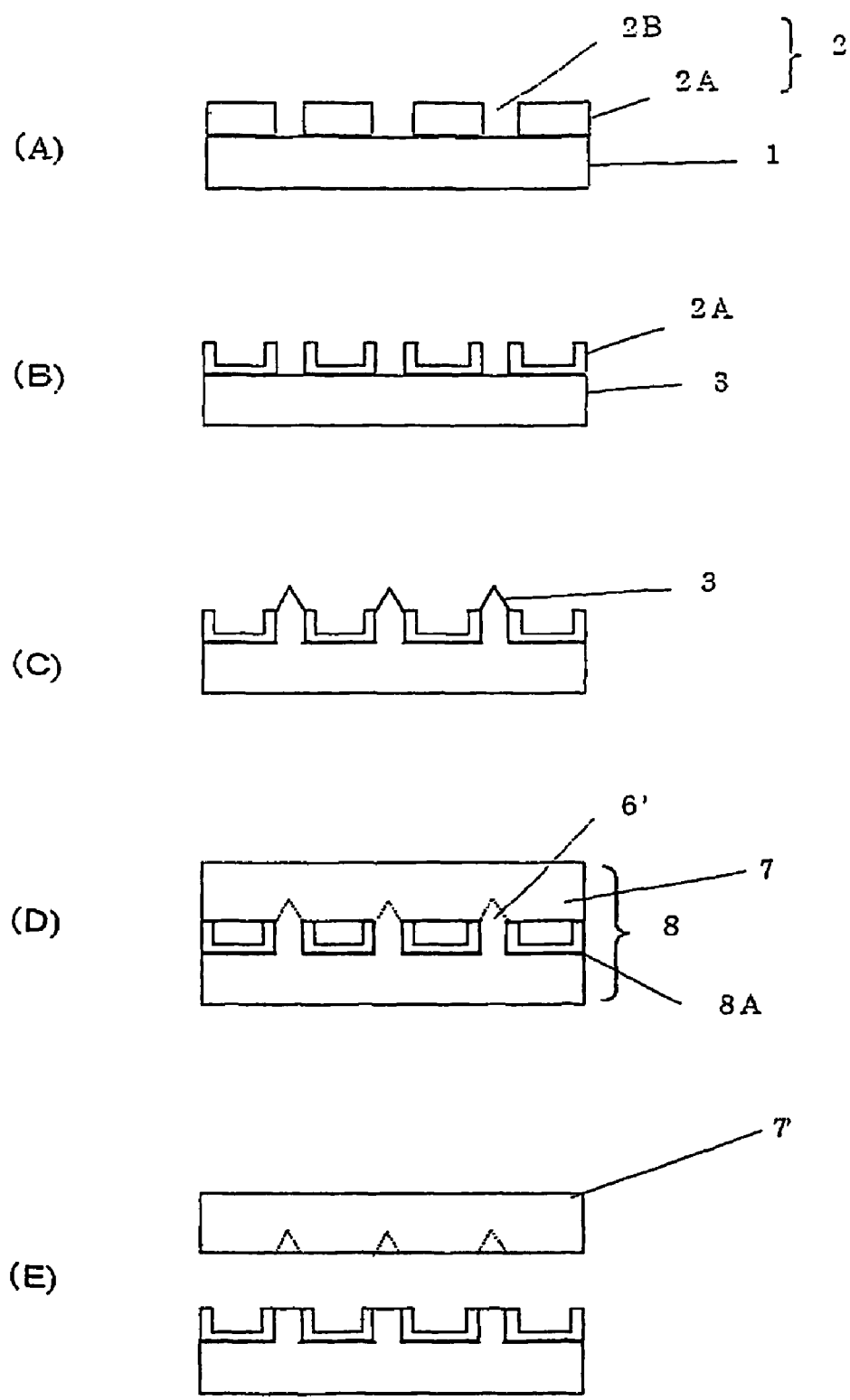
FIG. 5 is a schematic view showing a process for producing a free standing substrate of the present invention.

The step of covering with a mask so that only portions around points of a crystal having projection shapes constitute an opening as the first step can use steps, for example, as shown in FIGS. 4 and 5 in addition to the above-mentioned step. The example of FIG. 4 is a method in which a ground substrate carrying a pattern formed is dug by a method such as dry etching and the like to form projection shapes, then, a second mask is formed so that only portions around the points of the projection shapes constitute an opening. In this method, growth of a III-V group compound semiconductor may be conducted only once.

The example of FIG. 5 is a method in which the thickness of a mask to be formed on a ground substrate is made relatively larger, a concave is formed on this mask, then, a flat crystal having a void internally is obtained by selective growth and lateral growth. In this method, growth is conducted under conditions wherein oblique facet is formed in selective growth, then, the growth conditions are changed so that lateral growth is dominant before growing.

Thus, a free standing GaN substrate 7' can be obtained. When free standing GaN substrate is used, by conducting homo-epitaxial growth of GaN on this by a HVPE method and the like, the thickness of a GaN substrate of low dislocation can be sufficiently increased and use as an ingot can be made possible.

Figure 2:
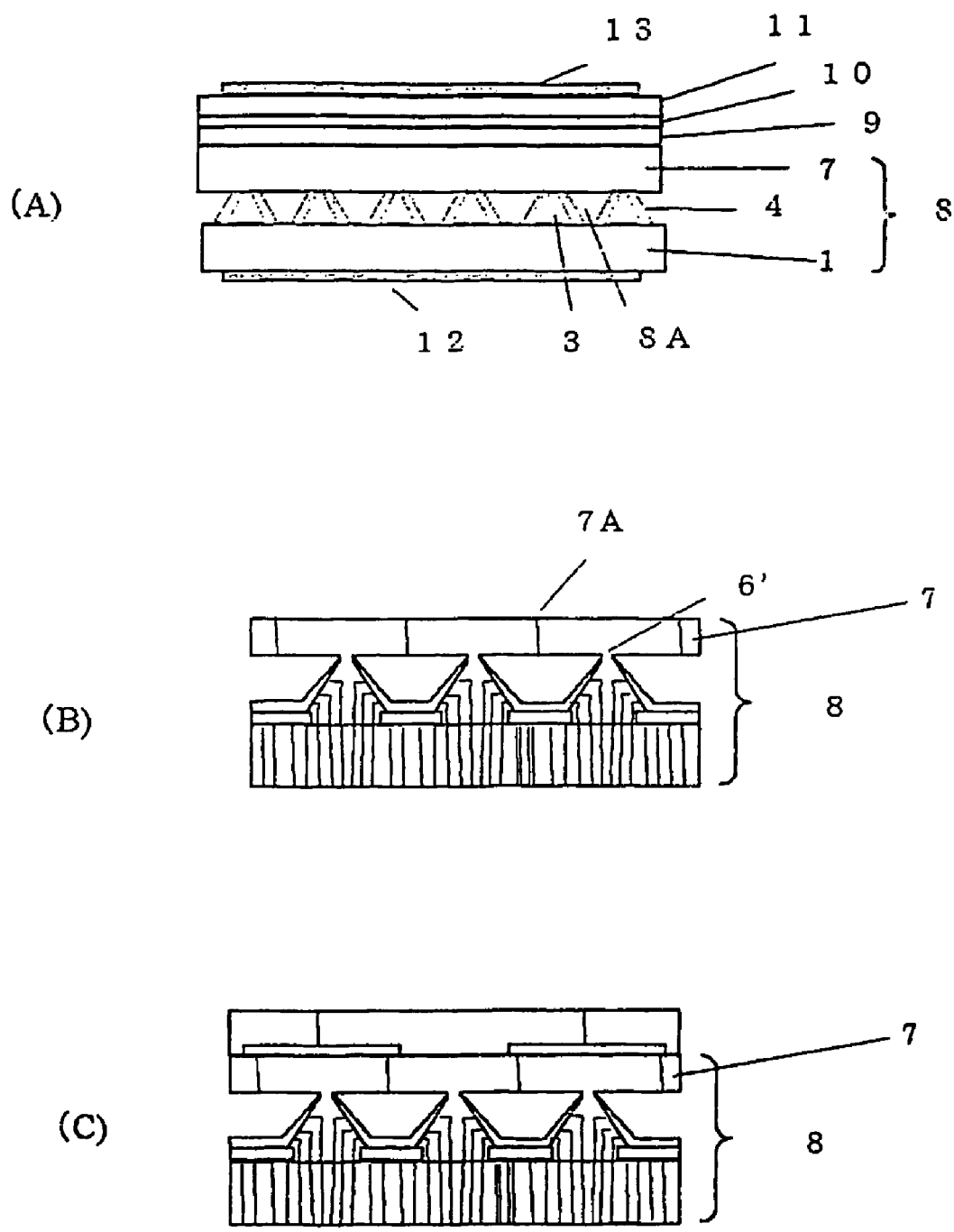
FIG. 2 (A) is a view showing one example of a device utilizing an epitaxial substrate of the present invention, (B) is a view schematically showing the condition of reduction in dislocation density in the present invention, and (C) is a view schematically showing a method of reducing dislocation density by repetition of lateral growth.

Further, by increasing the area proportion of a seed crystal (opening 6) in the first step of the present invention, a crystal 8 having a specific structure containing avoid 8A left internally can be obtained without peeling of a GaN layer. There is a possibility of producing a novel element as shown in FIG. 2 (A) by utilizing this structure. FIG. 2 (A) shows a light emitting diode containing a metal layer of high light reflectance as the mask 4 used in the first step, embedded in a crystal. By this, a light exiting toward lower direction from a light emitting layer 10 can be reflected toward upper direction to obtain LED manifesting improved light emergence efficiency.

A GaN opening 6 around a crystal point formed in the first step acts as a seed crystal for crystal growth in the second step for forming a flat layer. A crystal grown laterally from a seed crystal takes over the direction of the seed crystal, resultantly, there are little dislocations in this. Since the most of dislocations taken over from a template are refracted along the horizontal direction internally and ended at an oblique facet plane, in a step of growing a projection shape 3, the dislocation of a template taken over to a flat layer 7 re-grown exists substantially only at a projection point as a seed crystal. Consequently, the dislocation density of the whole flat layer can be reduced effectively.

Dislocation transmitted from a template to a flat layer occurs only at a seed crystal portion as described above, however, dislocation occurs newly at an associated portion 7A of the flat layer in some cases. The reason for this is that due to fluctuation of a crystal axis in a (0001) plane of a seed crystal, the orientations of mutually adjacent seed crystals shift slightly and a grain boundary of small inclined angle is generated at an association portion of a laterally grown portion, and a dislocation is arranged along this. This condition is shown schematically in FIG. 2 (B).

By repeating embedded growth by lateral growth, new dislocations occurring at an association portion can be reduced in some cases. For reducing dislocations on a grain boundary of small incline angle occurring at an association portion, it is necessary to increase distance until association by lateral growth and to increase the size of individual grains surrounded by the grain boundary of small incline angle. For conducting this, it may be advantageous that in a pattern used before the first step conducted at second time, the period of the pattern is made larger than the period of the first time. Thus, the remaining dislocation density can be further reduced. This condition is schematically shown in FIG. 2 (C). As the method of embedded lateral growth, the second or later steps in the present invention may be used as they are, however, more simply, it may be also permissible that a pattern is formed on a flat layer obtained in the first time and embedded lateral growth is only conducted directly on this.

The present invention will be illustrated more specifically by examples below, however, the scope of the invention is not limited only to these examples.

EXAMPLE 1

A SiO$_2$ mask formed by a vapor deposition method using a sample obtained by forming an un-doped GaN layer 1 with a thickness of about 3 μm on a GaN buffer layer grown at lower temperature by a MOCVD method on a sapphire (0001) plane substrate having a thickness of 430 μm was worked by a usual photolithography method so as to form stripe patterns along the <1-100> direction of the GaN crystal. The width of a SiO$_2$ stripe portion 2A and the width of a window portion 2B are both 5 μm.

This was placed on a MOCVD reaction furnace and crystal growth in the first step was conducted using H$_2$ as a carrier gas and using TMG and NH$_3$ at a growth pressure of 0.66 atm and a growth temperature of 950° C., to grow GaN$_3$ having projection shapes composed of {11-22} plane facet.

Next, the first step was conducted to produce a sample with a SiO$_2$ mask having openings only at portions around projection portions. That is, first, the whole surface was covered with a SiO$_2$ layer 4 having a thickness of 100 nm by a RF sputtering method. Next, a photoresist layer 5 was formed by spin coating and baking, the photoresist at the projection points was removed by an oxygen plasma ashing apparatus to expose a SiO$_2$ layer at this portion. Then, the exposed SiO$_2$ portion was removed by conducting a buffered hydrofluoric acid treatment. Finally, the photoresist was removed with an organic solvent. Thus, a sample with a SiO$_2$ mask having openings only at projection point portions 6 obtained in the first step was made. The area proportion of the openings was about 40%.

Next, the sample obtained in the first step was placed on a MOCVD apparatus and crystal growth in the second step was conducted to obtain a flat GaN crystal having a thickness of 3 µm. Conditions in this crystal growth include a growth pressure of 0.66 atm and a growth temperature of 1050° C.

Based on a sectional SEM photograph of the resulted crystal, formation of a crystal was confirmed in which voids having oblique facet at the side surface covered with $SiO_2$ were left internally. As a result of evaluation by cathode luminescence, dislocations were concentrated at an association portion of lateral growth and the dislocation density was $1 \times 10^5$ cm$^{-2}$ or less at portions other than the association portion. The average dislocation density of the whole crystal was $1 \times 10^7$ cm$^{-2}$.

EXAMPLE 2

Crystal growth was conducted in the same manner as in Example 1 except that a HVPE method was used instead of a MOCVD method and the thickness of the grown crystal was 100 µm in the crystal growth method in the second step. The growth conditions for HVPE included use of $N_2$ as a carrier gas and use of ammonia, hydrogen chloride gas and gallium metal as raw material, and a growth pressure of normal pressure and a substrate temperature 1070° C.

When the sample completed growth was removed from there action furnace, the layer grown in the third step was peeled naturally to obtain a free standing substrate.

As a result of evaluation of the resulted crystal by cathode luminescence, dislocations were concentrated at an association portion of lateral growth and the dislocation density was $1 \times 10^5$ cm$^{-2}$ or less at portions other than the association portion. The average dislocation density of the whole crystal was $5 \times 10^7$ cm$^{-2}$.

As a result of evaluation of warp, the curvature radius of warp was about 2 m, confirming an extremely flat free standing substrate.

EXAMPLE 3

As the mask patterns for growth of a crystal having projection shapes, a pattern having superimposed two stripes along the crystallographically equivalent <1-100> direction crossing mutually at an angle of 60° was used instead of a stripe pattern along one direction. In one direction, the width of the mask portion and the width of the opening are both 5 µm, and in another direction, the width of the mask portion and the width of the opening are 7 µm and 3 µm, respectively. As shown in FIG. 3 (A), it is a mask in which mask portions of parallelogram shape are arranged regularly in disaggregation mode in openings.

Crystal growth was conducted in the same manner as in Example 2 except that the oxygen plasma ashing time was controlled so that the area proportion of openings of the mask in the first step was 70%, in addition to the above-mentioned variations.

As a result of evaluation of the resulted crystal by cathode luminescence, dislocations were concentrated at the center of the mask and different facet-associated portions (that is, association portion of lateral growth), and the dislocation density was $1 \times 10^5$ cm$^{-2}$ or less at portions other than the association portion. The average dislocation density of the whole crystal was $3 \times 10^7$ cm$^{-2}$.

EXAMPLE 4

As the mask patterns for growth of a crystal having projection shapes, a pattern of a stripe along a <1-100> direction and two stripes mutually crossing along a <11-20> direction superimposed was used. The width of the mask portion of a stripe along a <1-100> direction and the width of the opening are both 5 µm, and the width of the mask portion along a <11-20> direction and the width of the opening are 7 µm and 3 µm, respectively. As shown in FIG. 3 (B), it is a mask in which mask portions of rectangle shape are arranged regularly in disaggregation mode in openings.

Crystal growth was conducted in the same manner as in Example 3 except that the oxygen plasma ashing time was controlled so that the area proportion of openings of the mask in the first step was 70%, in addition to the above-mentioned variations.

As a result of evaluation of the resulted crystal by cathode luminescence, dislocations were concentrated at the center of the mask and different facet-associated portions (that is, association portion of lateral growth), and the dislocation density was $1 \times 10^5$ cm$^{-2}$ or less at portions other than the association portion. The average dislocation density of the whole crystal was $7 \times 10^7$ cm$^{-2}$.

According to the present invention, a free standing substrate of a nitride-based III-V group compound semiconductor single crystal having small dislocation density and manifesting small warp can be obtained. This free standing substrate of a nitride-based III-V group compound semiconductor single crystal can be used widely as a substrate for a nitride-based III-V group compound semiconductor device, and enables production particularly of ultraviolet ray emitting LED and laser diode having high reliability, that is, this free standing substrate is extremely useful.

The invention claimed is:

1. A method for producing an epitaxial substrate having a III-V group compound semiconductor crystal represented by the general formula $In_xGa_yAl_zN$ (wherein, $x+y+z=1, 0 \leq x \leq 1, 0 \leq y \leq 1, 0 \leq z \leq 1$) having reduced dislocation density, comprising a first step of covering with a mask made of a different material from the III-V group compound semiconductor so that only portions around points of the crystal constitute openings by using a III-V group compound semiconductor crystal having a plurality of projection shapes and a second step of growing the III-V group compound semiconductor crystal laterally by using the III-V group compound semiconductor crystal at the opening as a seed crystal, wherein the III-V group compound semiconductor crystal having a plurality of projection shapes in the first step is obtained by using the III-V group compound semiconductor crystal as a template, covering this with a mask having a plurality of openings, then, selectively growing the III-V group compound semiconductor crystal from the opening so as to form an oblique facet against the surface of the template.

2. A method for producing a free standing substrate of a III-V group compound semiconductor crystal represented by the general formula $In_xGa_yAl_zN$ (wherein, $x+y+z=1, 0 \leq x \leq 1, 0 \leq y \leq 1, 0 \leq z \leq 1$) having reduced dislocation density, comprising a first step of covering with a mask made of a different material from the III-V group compound semiconductor so that only portions around points of the crystal constitute openings and the sum of the areas of the openings is ½ or less of the area projected from the upper direction of the III-V group compound semiconductor crystal having a plurality of projection shapes by using a III-V group compound semiconductor crystal having a plurality of projection shapes and a second step of growing laterally the III-V group compound semiconductor crystal by using the III-V group compound semiconductor crystal at the opening as a seed crystal, wherein the III-V group compound semiconductor crystal having a plurality of projection shapes in the first step is obtained by using the III-V group compound semiconductor crystal as a template, covering this with a mask having a plurality of openings, then, selectively growing the III-V group compound semiconductor crystal from the opening so as to form an oblique facet against the surface of the template.

\* \* \* \* \*